(12) United States Patent
Hasegawa

(10) Patent No.: US 6,672,877 B2
(45) Date of Patent: Jan. 6, 2004

(54) CONTACTOR BLOCK AND APPARATUS FOR ELECTRICAL CONNECTION

(75) Inventor: Yoshiei Hasegawa, Kawasaki (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 10/320,918

(22) Filed: Dec. 16, 2002

(65) Prior Publication Data

US 2003/0224635 A1 Dec. 4, 2003

(30) Foreign Application Priority Data

Jun. 4, 2002 (JP) ........................................ 2002-163089

(51) Int. Cl.[7] .............................................. H01R 12/00
(52) U.S. Cl. .............................. 439/66; 439/65; 439/67; 439/492; 439/493
(58) Field of Search ............................ 439/65, 66, 67, 439/492, 493, 76.2, 532, 716, 108, 91, 482, 533, 620

(56) References Cited

U.S. PATENT DOCUMENTS

| 3,936,133 | A | * | 2/1976 | Splitt et al. |
|---|---|---|---|---|
| 4,540,233 | A | * | 9/1985 | Saijo et al. |
| 5,297,970 | A | * | 3/1994 | Carney |
| 5,356,309 | A | * | 10/1994 | Carney et al. |
| 6,293,817 | B1 | * | 9/2001 | Hamren et al. |
| 6,338,629 | B1 | * | 1/2002 | Fisher et al. |
| 6,431,880 | B1 | * | 8/2002 | Davis et al. |

FOREIGN PATENT DOCUMENTS

| JP | 08-144867 | 11/1997 |
|---|---|---|
| JP | 05-349498 | 6/1998 |
| JP | 10-317569 | 5/2000 |
| JP | 10-324071 | 5/2000 |
| JP | 2000-043146 | 8/2001 |

* cited by examiner

*Primary Examiner*—Anthony Dinkins
*Assistant Examiner*—Nguyen T. Ha
(74) *Attorney, Agent, or Firm*—Graybeal Jackson Haley LLP

(57) ABSTRACT

A contactor block is characterized by including a beam-like holder having an underside and a retreat portion formed on a side following the underside; and a contact sheet provided with a plurality of contactors at intervals in the longitudinal direction of the holder and disposed in the outer periphery of the holder so as to be located on the underside of the holder.

9 Claims, 15 Drawing Sheets

CONTACTOR BLOCK AND APPARATUS FOR ELECTRICAL CONNECTION

BACKGROUND OF THE INVENTION

1. Field of the Invention

The present invention relates to a contactor block and an apparatus for electrical connection using a contact sheet such as a probe sheet.

2. Description of Prior Art

It is desired recently that, in an apparatus for electrical connection such as a probe card, electric tests of a plurality of integrated circuits formed in the same semiconductor wafer can be carried out simultaneously.

As an apparatus of such a type, it has been proposed to produce a plurality of so-called contactor blocks and/or probe blocks, in which a probe sheet using, as a probe element, a part of wiring formed on an insulating film and/or a contact sheet are assembled into a holder, and to assemble such contactor blocks into a frame (Japanese Patent Appln. Public Disclosure (KOKAI) No. 2000-147005 and No. 2000-150595).

Such a conventional type of contactor block uses a contact sheet on which a projected electrode acting as a contactor is disposed in each probe element as well as a plate-like holder, the contact sheet being wound round the holder. The conventional apparatus for electrical connection using such contactor blocks has a plurality of contactor blocks assembled into the frame at intervals in the thickness direction of the holder.

According to the conventional contactor blocks, however, there is no space for disposing a circuit element such as a capacitor to be connected to a source, so that it cannot help disposing the circuit element in a member other than the contactor blocks, for example, in the frame where the contactor blocks are disposed. As a result, a passage for electricity between the circuit element and the contactors should be too long to conduct an accurate electric test.

SUMMARY OF THE INVENTION

An object of the present invention lies in providing a space for a circuit element.

A contactor block according to the present invention comprises: a beam-like holder having an underside and a retreat portion formed on a side following the underside; and a contact sheet having a plurality of first contactors at intervals in the longitudinal direction of the holder, the first contactors being arranged in the outer periphery of the holder so as to be located on the underside.

The retreat portion may be a downward staged portion formed on a side or an inclined side inclined to the underside. By disposing the contact sheet on the outer periphery of the holder including such a retreat portion, a retreat area is formed, where a position of the contact sheet corresponding to the retreat portion is retreated from the side.

The contactor block having such a retreat area can dispose one or more circuit elements such as a capacitor at a position of the contact sheet corresponding to the retreat area. By doing so, even if a plurality of the first contactor blocks are juxtaposed in support means such as the frame, it is possible not only to reduce a layout pitch of the contactor blocks at least by the thickness dimension of the circuit element but also to conduct an accurate electric test because the electric paths between the circuit element and the first contactors are shortened.

The holder further may have an upside opposite to the underside, and the contact sheet may further have a plurality of second contactors spaced apart in the longitudinal direction of the holder and arranged at the positions corresponding to those on the upside of the holder, and a plurality of wiring portions electrically connecting the first contactors and the second contactors with a relation of one-to-one correspondence.

The holder may further have a plurality of recesses extending in the longitudinal direction of the holder within the arrangement range of one or more corresponding contactor groups each including two or more of the first contactors made to correspond individually, the recesses opening at least on the underside, and one or more female screw holes each communicating to the corresponding recess, the screw holes being made to correspond to each recess. In each recess, an elastic plate abutting on the arrangement area of the corresponding contactor groups in the contact sheet and a pressure plate abutting on the upside of the elastic plate are disposed, and an adjusting screw abutting on the top plate of the pressure plate may be disposed in each screw hole. With such an arrangement, by adjusting the amount of screwing of the adjusting screw into the female screw hole, the amount of projection of the contactor from the holder can be adjusted, so that the height position of the contactors with respect to the holder can be adjusted for each contactor group.

In place of the foregoing, it is possible that the holder further has a plurality of recesses extending at intervals in the longitudinal direction of the holder and opening at least on the underside, and a plurality of female screw holes communicating to the corresponding recesses, the screw holes being made to correspond to respective recesses, that in each recess an elastic plate abutting on the contact sheet and a pressure plate abutting on the elastic plate are disposed, and that an adjusting screw abutting on the upside of the pressure plate may be disposed in each screw hole. Even by doing so, the amount of projection of the contactors from the holder can be adjusted by adjusting the amount of screwing of the adjusting screw into the female screw, so that the height position of the contactors with respect to the holder can be adjusted for each contactor group located in a support area.

The holder may further have one or more triangular flange portions projecting sideward from the side and having a bottom face on the same plane as the underside, and the contact sheet may have an extended area on the bottom face and an auxiliary contactor disposed in the extended area.

The contact sheet includes an insulating sheet member and a plurality of wiring portions disposed in parallel in the sheet member, wherein the first contactor is disposed at one end portion of the wiring, and the sheet member can have a plurality of slits which make the end portion of the wiring disposing the first contactor act as a probe element.

The apparatus for electrical connection according to the present invention comprises one or more contactor blocks such as the above-mentioned one and support means on which the contactor blocks are attached in parallel with each of their first contactors downward. By this apparatus for electrical connection, too, a similar action and effect to the above-mentioned contactor block can be obtained.

The support means can include a frame on which a plurality of contactor blocks are mounted in parallel with each of their first contactors downward, and a wiring board having a plurality of wiring portions and attaching the frame to its underside.

PREFERRED EMBODIMENT OF THE INVENTION

Figure 1:
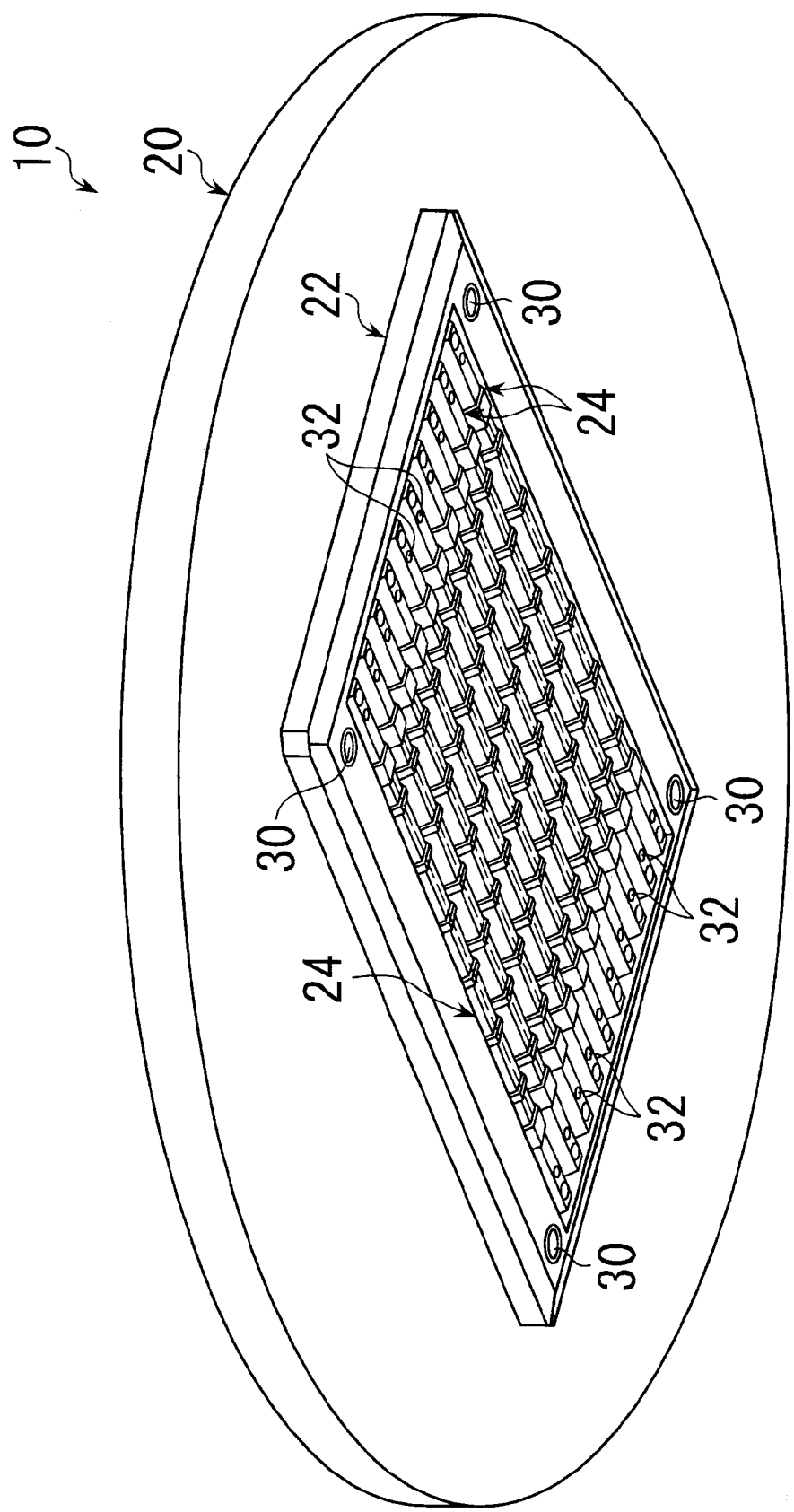
FIG. 1 is a perspective view showing an embodiment of the apparatus for electrical connection according to the present invention.
Figure 2:
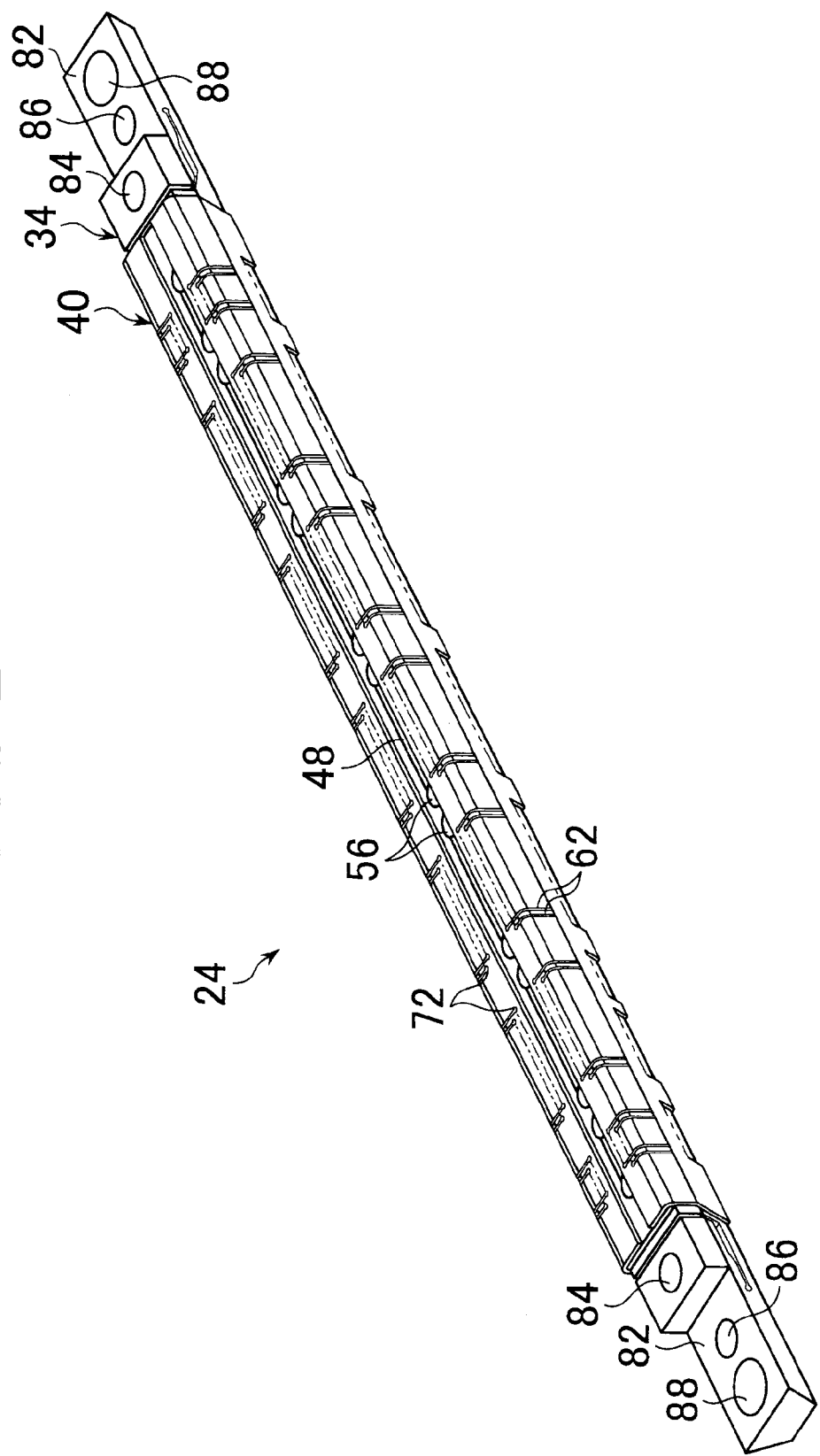
FIG. 2 is a perspective view showing an embodiment of the contactor block according to the present invention.
Figure 3:
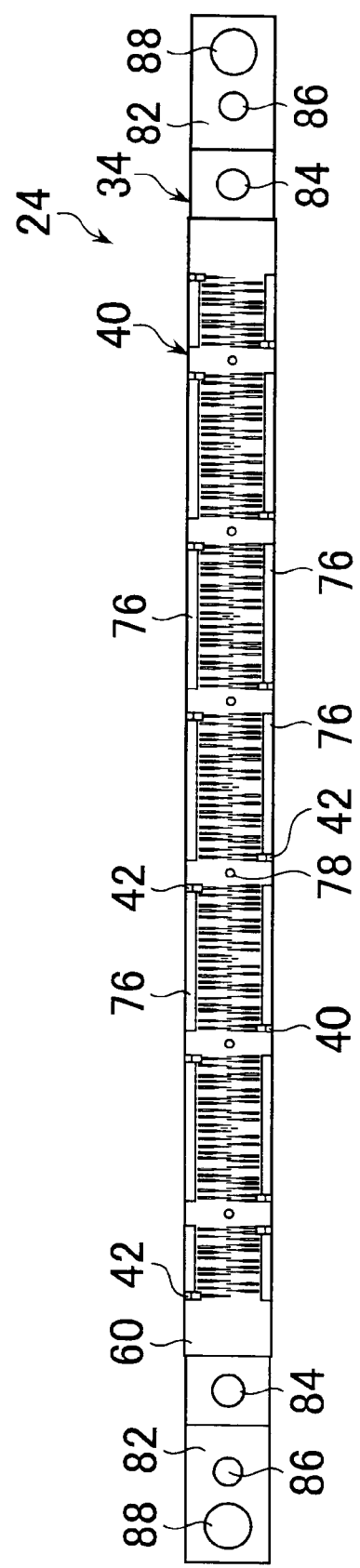
FIG. 3 is a bottom view of the contactor block shown in FIG. 2.
Figure 4:
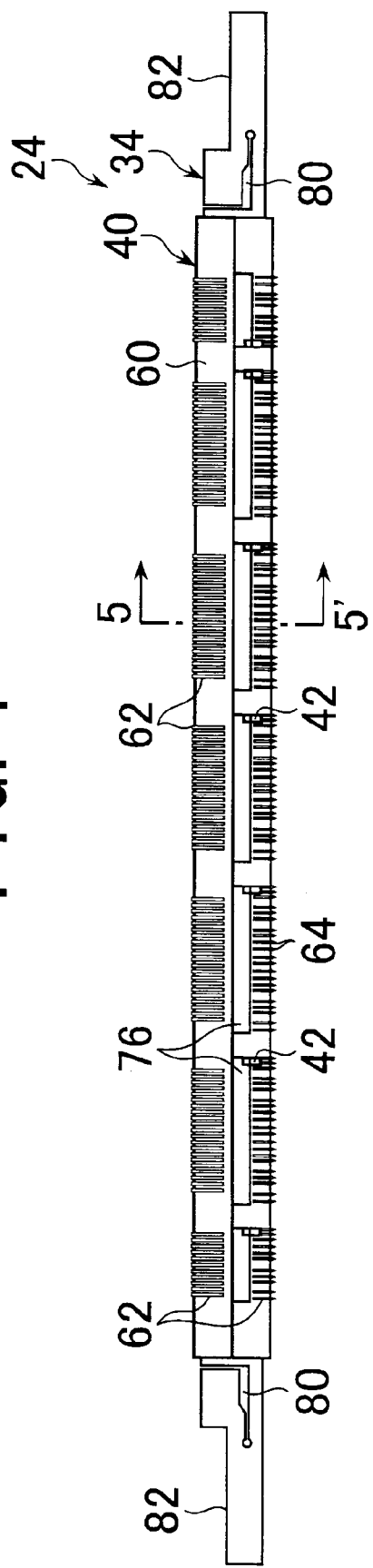
FIG. 4 is a front view of the contactor block shown in FIG. 2.
Figure 5:
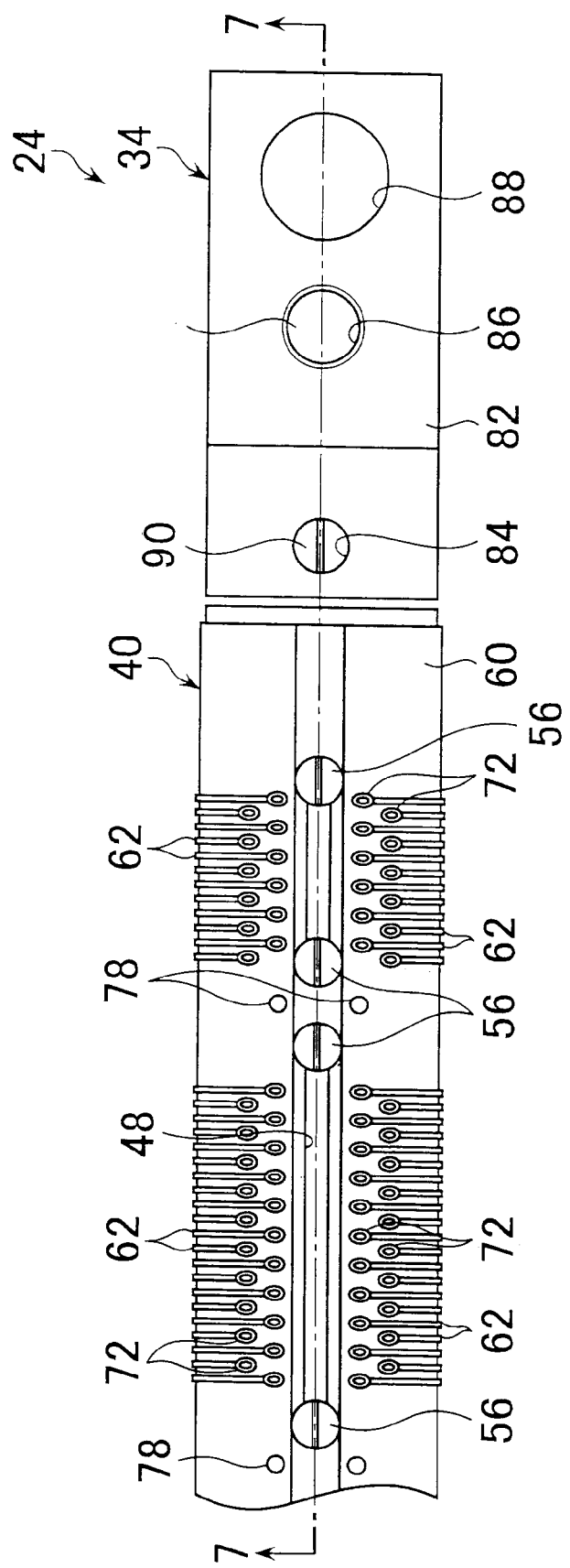
FIG. 5 is an enlarged plan view of a part of the contactor block shown in FIG. 2.
Figure 6:
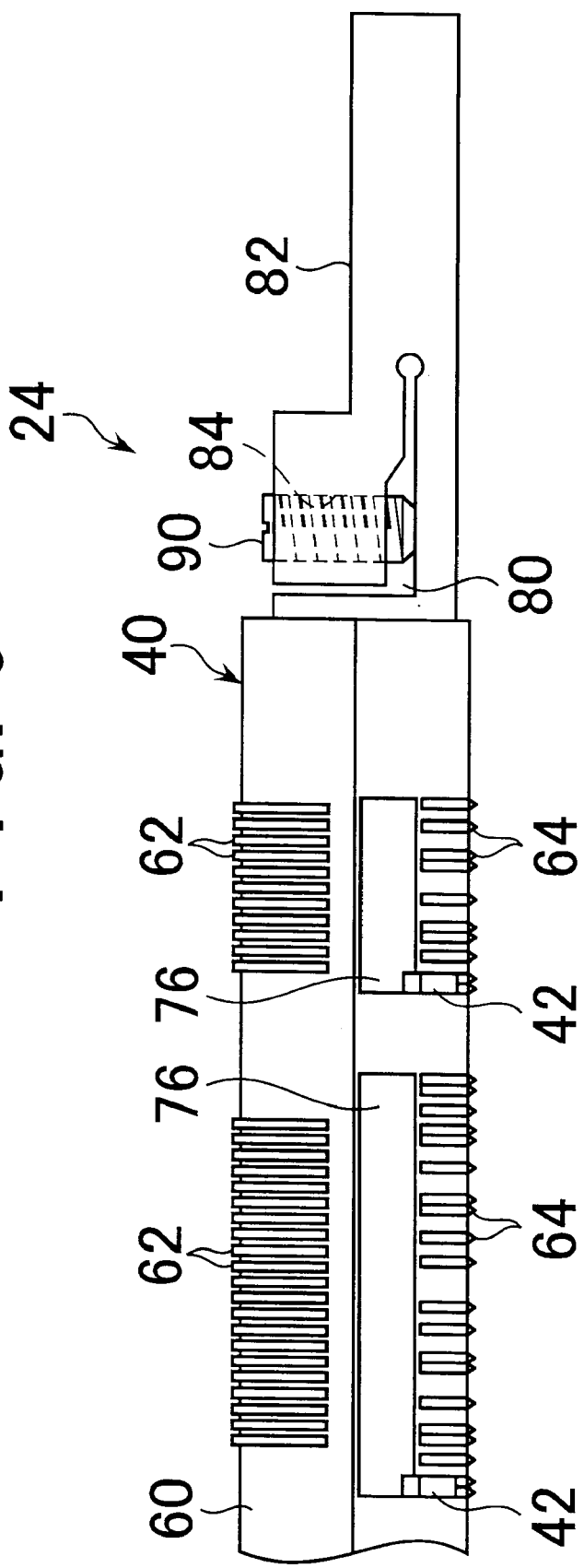
FIG. 6 is an enlarged front view of a part of the contactor block shown in FIG. 2.
Figure 7:
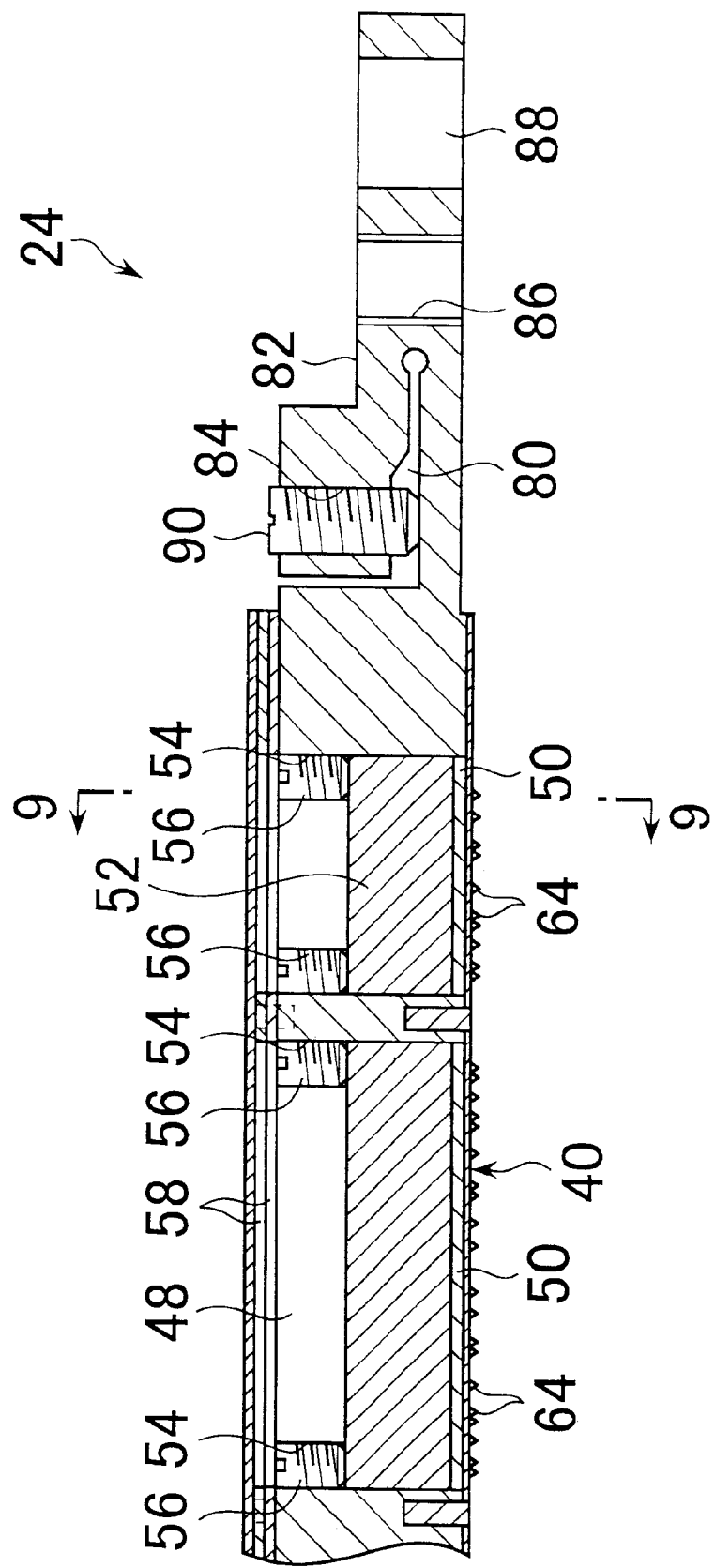
FIG. 7 is a sectional view obtained along line 7—7 in FIG. 5.
Figure 14:
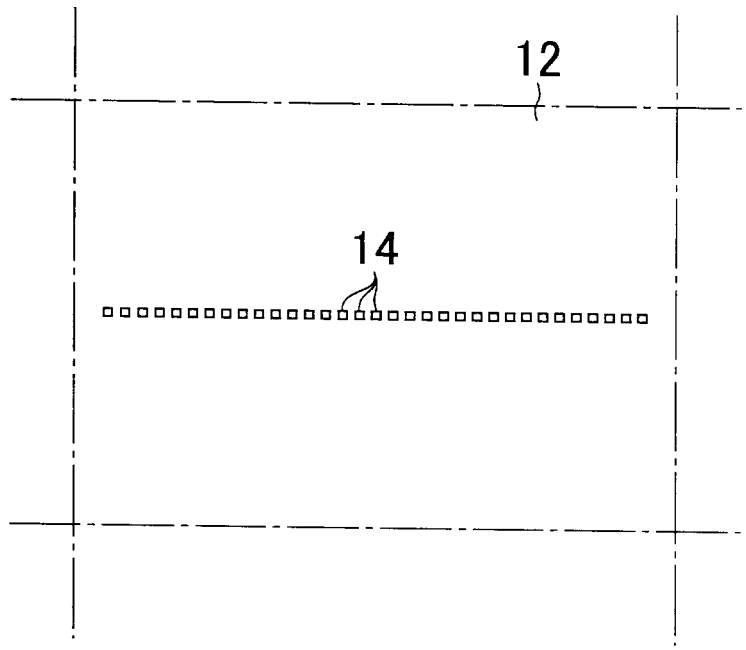
FIGS. 14(A) and 14(b) are views showing examples of arrangement of pad electrodes in the integrated circuits as material to be inspecteds, FIG. 14(A) showing a first example and FIG. 14(B) a second example.
Figure 14:
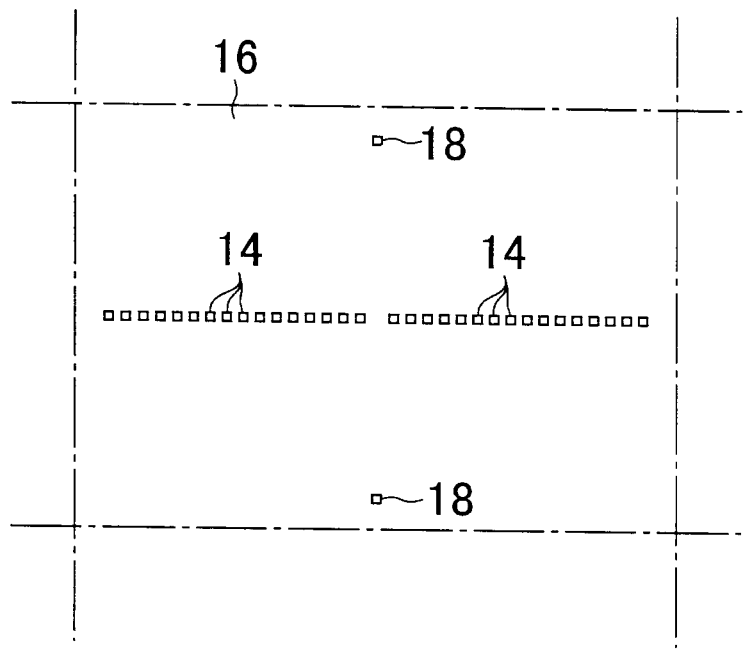

Referring to FIG. 1, the apparatus 10 for electrical connection is constituted so as to be used as a probe card in a tester for simultaneously conducting electric tests of plural rectangular integrated circuits like, for example, the integrated circuits 12 shown in FIG. 14, formed on one semiconductor wafer.

Integrated circuits as objects to be inspecteds can be constituted to have a suitable arrangement pattern of electrodes such as one having a plurality of pad electrodes 14 in a row at intervals in the longitudinal direction at the widthwise central portion of the integrated circuit 12 as shown in FIG. 14(A), or such as one further having pad electrodes 18 at both ends in the widthwise direction at the longitudinal central portion of the integrated circuit 16 as shown in FIG. 14(B).

The apparatus 10 for electrical connection comprises a disk-shaped wiring board 20 made of an insulating material, a frame 22 assembled into the underside of the wiring board 20, and a plurality of long contactor blocks 24 assembled in parallel into the frame 22.

Figure 10:
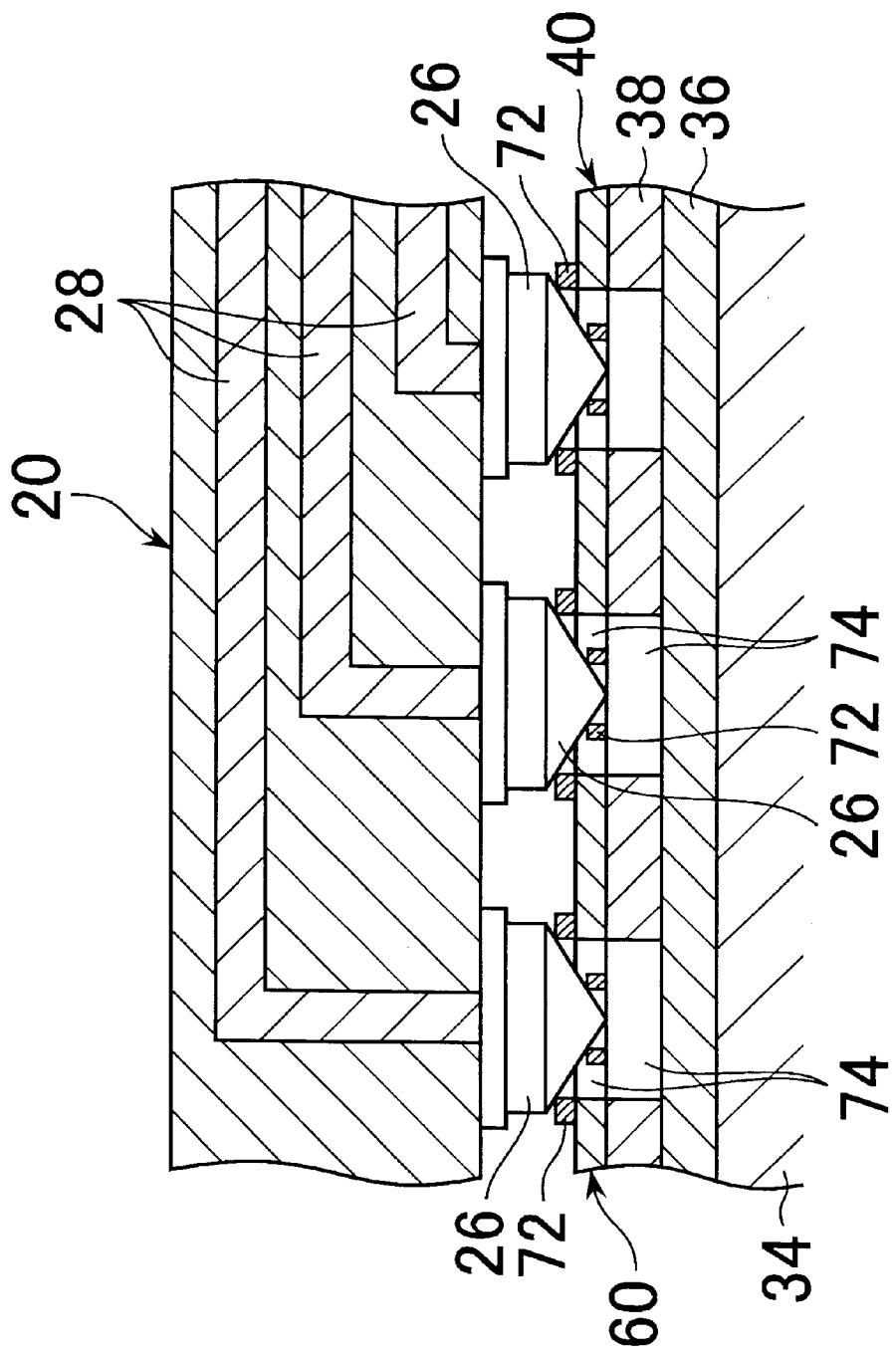
FIG. 10 is a sectional view showing an embodiment of the wiring board and the contactor block in an electrically connected state.

The wiring board 20 has, as shown in FIG. 10, a plurality of tester lands (not shown), a plurality of projected electrodes 26 electrically connected to the contactor blocks 24, and a plurality of wiring portions 28 electrically connected to the tester lands and the projected electrodes 26 in a one-to-one form. The projected electrode 26 has a conical (or pyramidal) vertex.

The frame 22 is made to have a rectangular shape so as to form a rectangular opening and is mounted on the wiring board 20 by a plurality of screw members 30. The contactor blocks 24 are assembled, so as to extend in parallel to each other, into the underside of the frame 22 by a plurality of screw members 32.

In the following is explained an embodiment of the contactor blocks 24 to be applied to the integrated circuit 12 having the arrangement pattern of electrodes as shown in FIG. 14(A).

Each contactor block 24 includes a beam-like holder 34, a strip-like elastic plate 36 disposed on the upside of the holder 34, a strip-like spacer 38 disposed on the elastic plate 36 in an overlapped state, a contact sheet 40 wrapped round the outer periphery of a holder assembly in which the holder 34, the elastic plate 36 and the spacer 38 are laid overlapping each other, and a plurality of circuit elements 42 like capacitors connected to a source.

The holder 34 has a substantially trapezoidal shape in section with two inclined sides rising obliquely from the underside and each widthwise end portion of the underside, the vertical side rising upward from each inclined side and the upside opposite to the underside. These faces are formed continuously in the longitudinal direction of the holder 34 with the exception of the both end areas of the holder 34.

One or more glue storages 44 are formed respectively on the underside, both inclined sides and both vertical sides of the holder 34. Each glue storage 44 opens in the corresponding face, and is continuously formed in the longitudinal direction of the holder 34 with the exception of both the end areas of the holder 34. Each glue storage 44 is utilized to store adhesive for attachment of the contact sheet 40 to the holder 34.

The holder 34 also has a pair of a plurality of first recesses 46 opening downward and a plurality of second recesses 48 communicating to the first recesses 46 at intervals in the longitudinal direction of the holder 34 in the area except both the end areas. The pairing first and second recesses 46 and 48 are formed to penetrate the holder 34 in its thickness direction. The width dimension of the first recess 46 is greater than that of the second recess 48.

In each first recess 46, an elastic plate 50 of a rectangular parallelopiped like a rectangular rubber plate having substantially the same width dimension as that of the second recess 48 is disposed so as to abut on the contact sheet 40. In each second recess 48, a pressure plate 52 is disposed. The elastic plate 50 and the pressure plate 52 extend in the longitudinal direction of the holder 34.

The holder 34 further has a female screw hole 54 at each longitudinal end portion of each second recess 48. Into each female screw hole 54, an adjusting screw 56 is screwed.

The elastic plate 36 and the spacer 38 of the contactor block 24 extend in the longitudinal direction of the holder 34, and each has a plurality of holes 58, 58 individually corresponding to the second recess 48. Each hole 58 has approximately the same length dimension as that of the corresponding second recess 48.

The contact sheet 40 is provided with a film 60 formed to be rectangular from an insulating material such as polyimide and a plurality of wiring portions 62 formed in parallel on the film 60 so as to extend widthwise at intervals in the longitudinal direction of the film 60.

Figure 8:
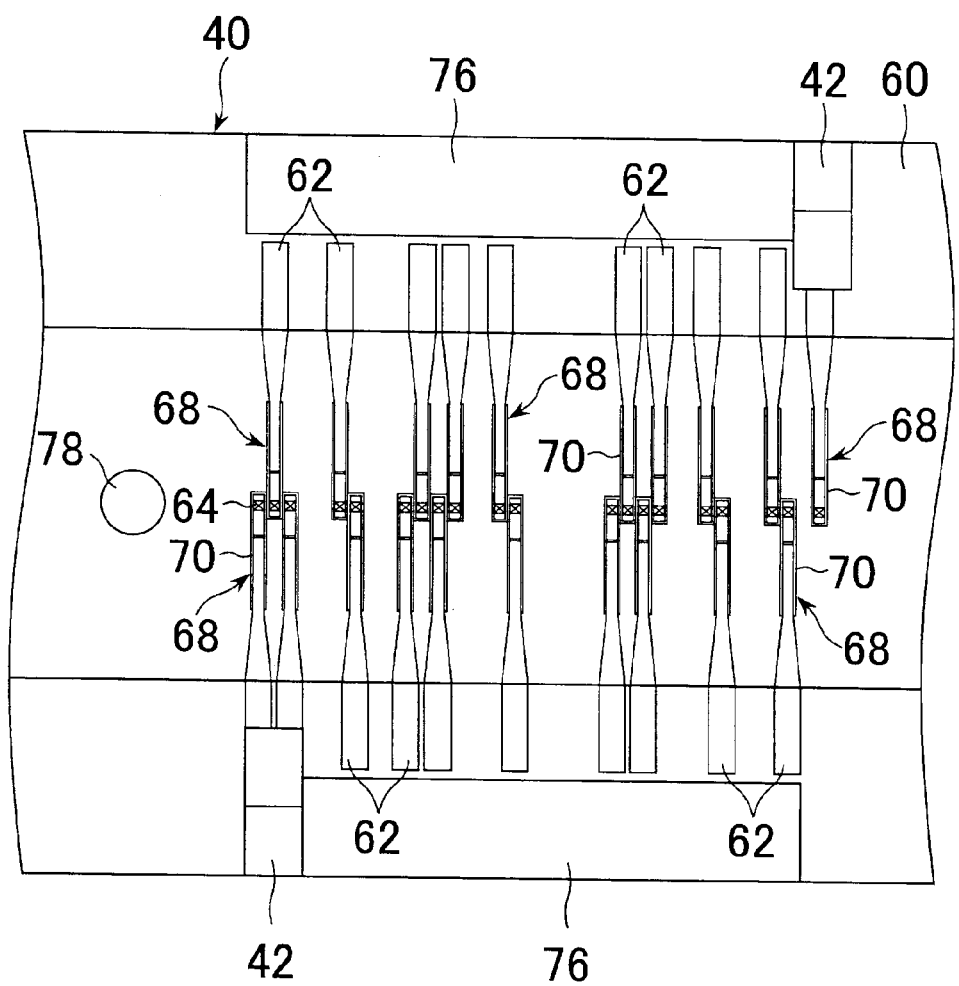
FIG. 8 is an enlarged bottom view of a part of the contactor block shown in FIG. 2.
Figure 9:
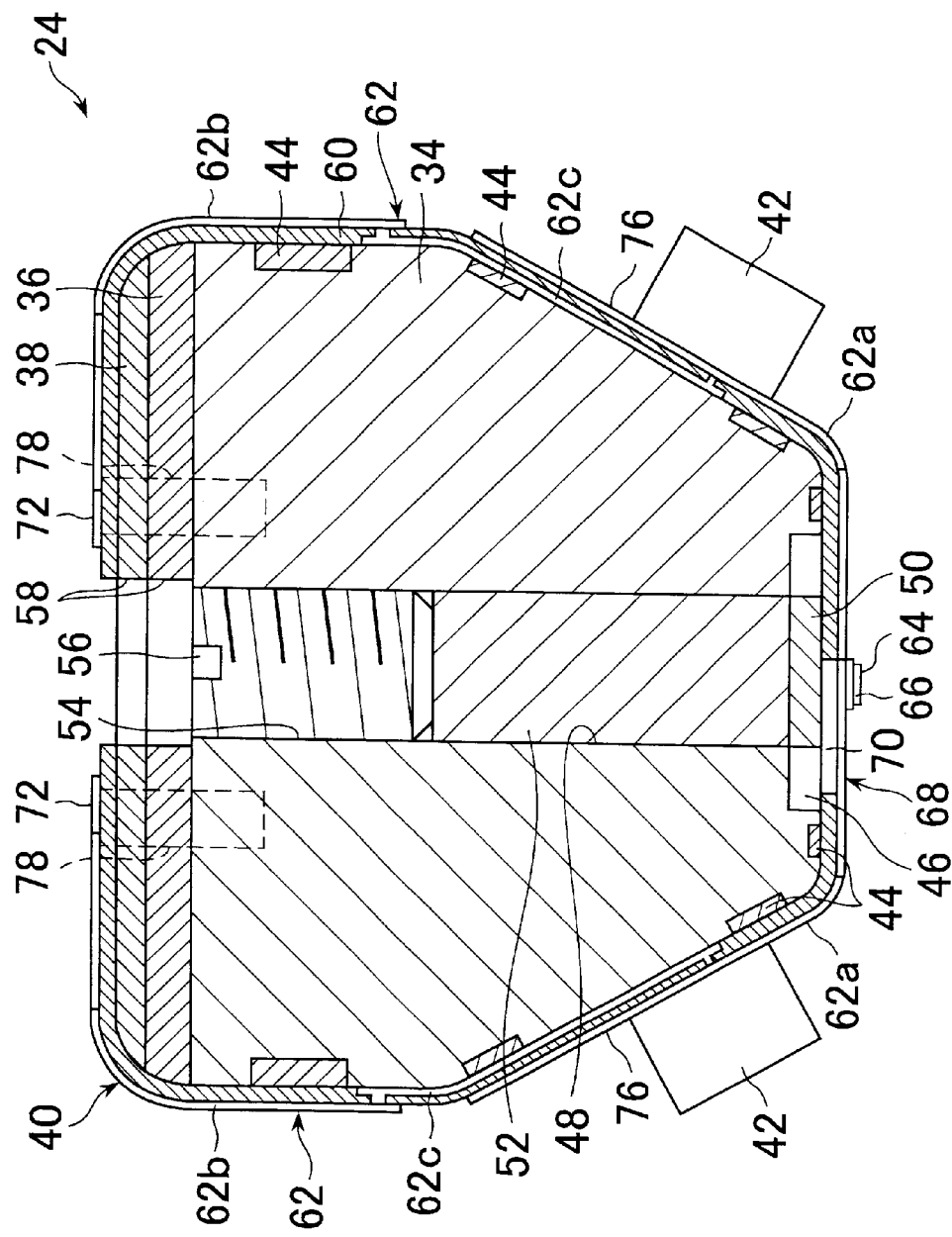
FIG. 9 is a sectional view obtained along line 9—9 in FIG. 7.

The wiring portions 62, as shown in FIG. 9, extend toward the widthwise end portions from the central portion in the widthwise direction of the film 60 and are spaced apart in the longitudinal direction of the film 60. In such wiring portions 62, as shown in FIGS. 8 and 9, there are wiring portions extending widthwise toward one end portion from the central portion of the film 60 and wiring portions extending toward the other end portion alternately in the longitudinal direction of the film 60.

Each wiring portion 62, as shown in FIG. 9, is formed such that wiring areas 62a and 62b at the center and the end portions in the widthwise direction of the film 60 are formed on one face of the film 60, wiring areas 62c between the wiring areas 62a, 62b are formed on the other face of the film 60, and the wiring areas 62a, 62b and 62c are electrically connected by a conductive portion such as a through hole formed on the film 60.

At the front end of the wiring area 62a of each wiring portion 62, there are formed projected contactors 64 with a conical, poly-pyramidal or semi-circular shape through a plurality of plate-like seats 66. The contactors 64 are aligned in one row in the longitudinal direction through the widthwise center of the film 60.

The film 60 has a U-shaped or a one-side-open rectangular slit 70 to make the front end portion of the wiring area 62a of each wiring portion 62 act as a probe element 68. According to this, adjoining probes 68 are made elastically deformable, independently from each other.

In contrast, at the front end of the end portion area 62b of each wiring portion 62, as shown in FIG. 10, there are formed connecting contactors 72 to be connected to the projected electrodes 26 of the wiring board 20. The spacer 38 and the film 60 have holes 74, 74 for allowing the connecting contactors 72 to elastically deform easily when each contactor 72 is pressed by the projected electrode 26.

It is preferable to use, as the connecting contactor 72, one that can elastically deforming when pressed by the projected electrode 26. However, another kind of the connecting contactor 72 such as a flat plate-like land, a through hole, etc., may be used.

On the film 60, there are arranged a plurality of electrode plates 76 to be connected to an earth of the source at intervals in the longitudinal direction of the holder 34 between the wiring areas 62a and 62b. Therefore, the contactors 64 are made to correspond to the first and the second recesses 46 and 48 and are divided into a plurality of contactor groups spaced apart in the longitudinal direction of the holder 34. Each electrode plate 76 is disposed to correspond to the first and the second recesses 46 and 48 of the holder 34.

The contact sheet 40 is wrapped round the holder assembly with the holder 34, the elastic body 36 and the spacer 38 superposed and adhered to the holder assembly such that the contactor 64 projects downward and the probe element 68 opposes to the first recess 46. In this state, the circuit element 42 is located in a corresponding position of the inclined side of the holder 34.

The holder 34 and the contact sheet 40 are positioned in that state at each of a plurality of portions on the underside and at a plurality of portions on the upside of the holder with a plurality of positioning pins 78 provided in the holder 34. The positioning pins 78 on the upside penetrate the elastic body 36 and the spacer 38.

At each end portion of the holder 34, there are formed a slit 80 which is L-shaped in section, a staged portion 82, female screw holes 84, 86, and a positioning hole 88. The female screw hole 84 is formed in a portion parted by the slit 80, and the female screw hole 86 and the positioning hole 88 are formed in the staged portion 82.

Into the female screw hole 84, the adjusting screw 90 is screwed with its front end abutted on a part of the lower side of the slit 80. The adjusting screw 90 can adjust the projection height of the area from the slit 80 toward the central side by adjusting the screwing amount into the female screw 84.

An attaching screw (not shown) for attaching the contactor block 24 on the frame 22 is screwed into the female screw hole 86. The positioning hole 88 receives a positioning pin (not shown) provided in the frame 22 when the contactor block 24 is mounted on the frame 22.

The contactor block 24 is mounted on the frame in a state that the staged portion 82 abuts on the frame 22. The height position of the contactor relative to the fame 22 can be adjusted for every contactor group by adjusting the screwing amount of the adjusting screw 90 into the female screw hole 84, and also by adjusting the screwing amount of the adjusting screw 56 into the female screw hole 54.

Since the contactor block 24 and the apparatus 10 for electrical connection using it have the circuit element 42 disposed at a corresponding position on the inclined side, even if a plurality of contactor blocks 24 are juxtaposed on the frame 22, it is possible not only to reduce the arranging pitch of the contactor blocks 24 at least by the thickness dimension of the circuit element 42 but also to shorten the electric path between the circuit element 42 and the contactor 64, thereby conducting an accurate electric test.

Adjustment of the height of the contactor 64 by the adjusting screws 56, 90 can be done at suitable times such as after they are assembled into the contactor assembly 24, after they are assembled into the apparatus 10 for electrical connection, after the apparatus 10 for electrical connection is assembled into a prober, etc. Also, it is possible to adjust the height of the contactor 64 by the adjusting screws 56, 90 during the electric test.

By increasing the screwing amount of the adjusting screw 56 into the corresponding female screw hole 54 to adjust the height of the contactor 64 by the adjusting screw 56, the elastic plate 50 is pressed against the contact sheet 40 by the pressure plate 52 to elastically deform the contact sheet 40 downward, thereby lowering the height position of the contactor 64.

On the other hand, if the screwing amount of the adjusting screw is decreased, the contact sheet 40 pushes up the elastic plate 50 and the pressure plate 52 by its own elastic force or contact pressure, thereby raising the height position of the contactor 64.

Likewise, if the screwing amount of an adjusting screw 90 into a corresponding female screw hole 84 is increased, the central area of the holder 34 is pushed down to be elastically deformed downward, thereby lowering the height position of the contactor 64. If the screwing amount of the adjusting screw 90 is decreased, the holder 34 is displaced upward by its own elastic force, thereby raising the height position of the contactor 64.

In the following is explained an embodiment of a suitable contactor block 100 used in an electric test of the integrated circuits shown in FIG. 14(B).

Figure 11:
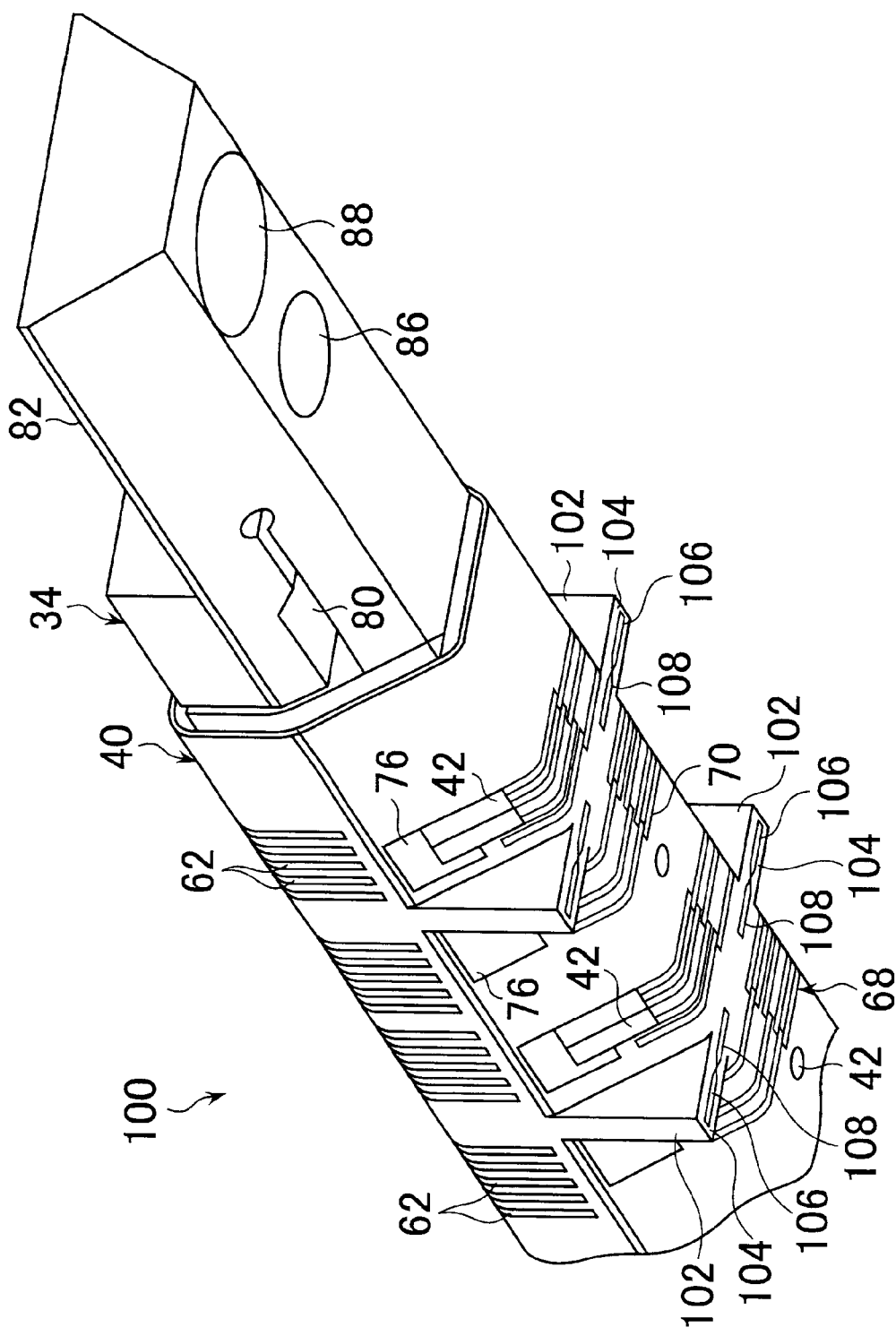
FIG. 11 is a partly perspective view showing another embodiment of the contactor block according to the present invention.
Figure 12:
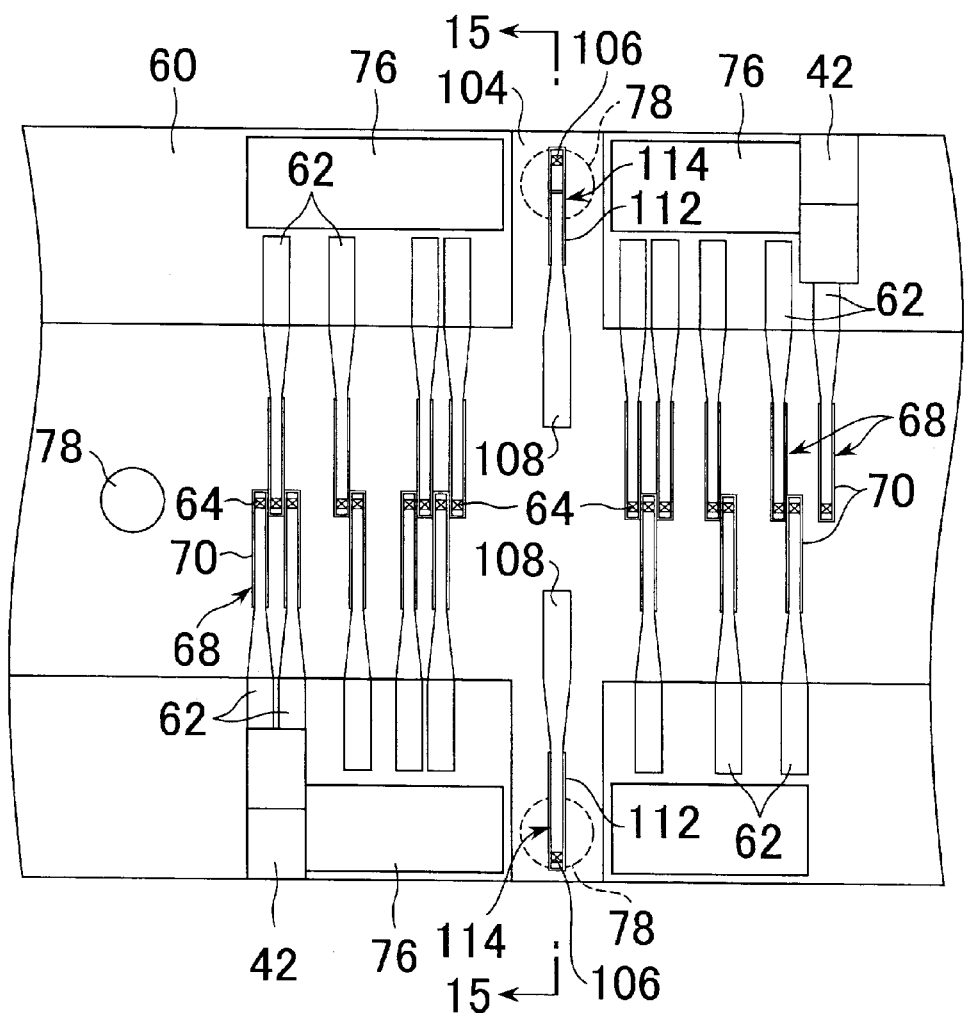
FIG. 12 is an enlarged bottom view of a part of the contactor block shown in FIG. 11.
Figure 13:
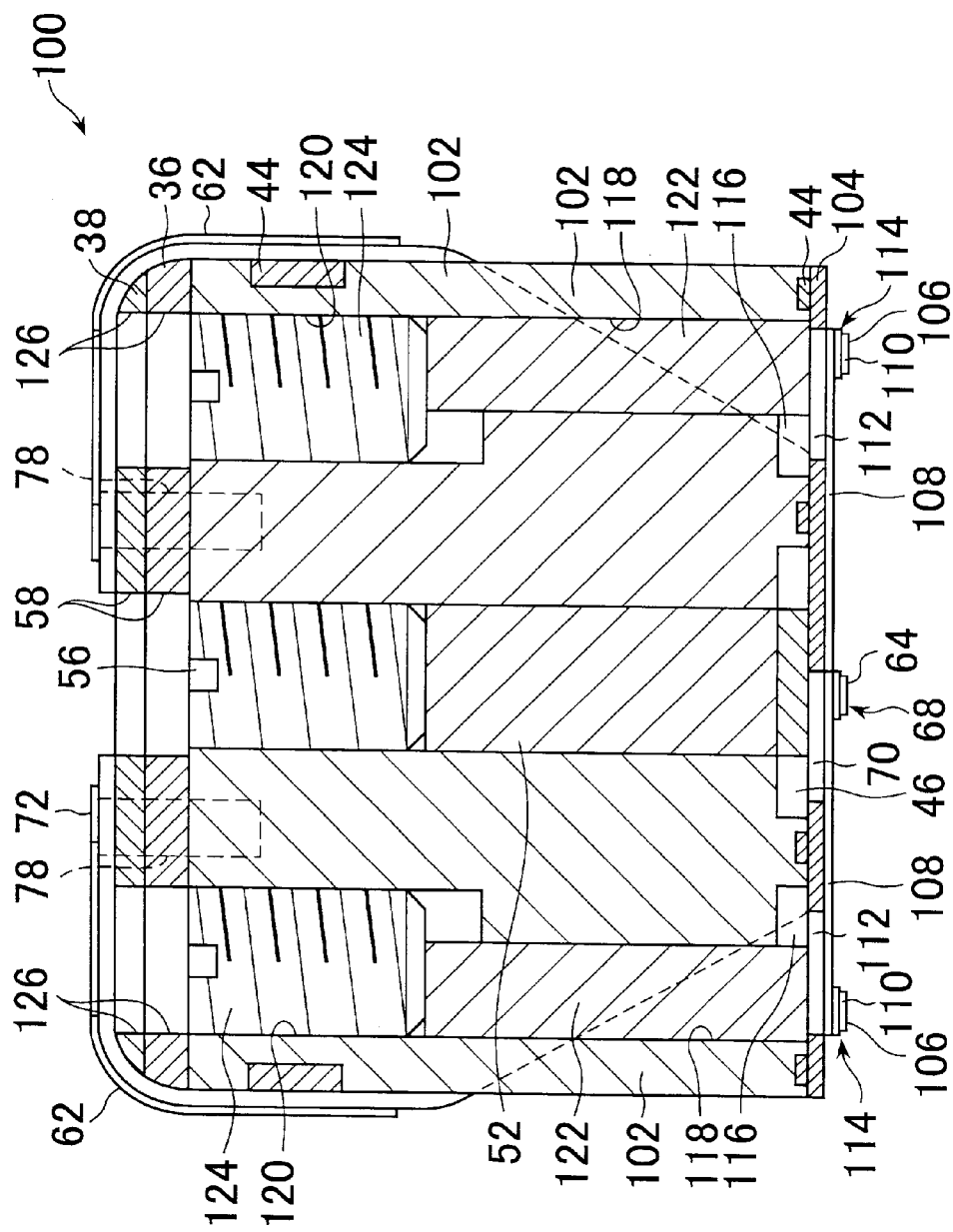
FIG. 13 is a sectional view similar to FIG. 9 of the contactor block shown in FIG. 11.

Referring to FIGS. 11–13, in the contactor block 100, the holder 34 is further provided with a triangular stop portion 102 on each inclined side at each corresponding portion between the adjoining first and second recesses 46 and 48, the stop portion 102 projecting sideward from the inclined side, and the contact sheet 40 is further provided with an extended area 104 disposed on the bottom face of each stop portion 102 and with an auxiliary contactor 106 disposed in the extended area 104.

The bottom face of each stop portion 102 is on the same plane as the underside of the holder 34. Each extended area 104 is formed by providing a slit shaped like the extended area 104 on the film 60. The auxiliary contactor 106 is pressed by the pad electrode 18 shown in FIG. 14(B) at the time of an electrical test.

Each auxiliary contactor 106, similarly to the wiring 62, is provided at an auxiliary wiring portion 108 formed on the film 60 through a seat 110 so as to extend from the central portion widthwise of the film toward the widthwise end portions. The front end of each auxiliary wiring portion 108 and the auxiliary contactor 106, similarly to the probe element 68, are made to be an auxiliary probe element 114 which is elastically deformable independently.

In the contactor block 100, every stop portion 102 of the holder 34 has a third and a fourth recesses 116, 118 penetrating the stop portion 102 in cooperation with each other in the thickness direction and a female screw hole 120. A rubber rod-like elastic body 122 is disposed in each of the third and the fourth recesses 116, 118 so as to contact the extended area 104.

The elastic body 122 reaches from the third recess 116 to a part of the female screw hole 120 through the second recess 118. The adjusting screw 124 is screwed into the female screw hole 120. This enables, by adjusting the screwing amount of the adjusting screw 124 into the female screw hole 120, to adjust the height position of the extended area 104, and furthermore, of the auxiliary contactor 106.

The elastic plate 36 and the spacer 38, respectively, have holes 126,126 for inserting the front end of a tool for operating the adjusting screw 124.

Both the contactor block 100 and an apparatus for electric connection using the same work similarly and give actions and effects similarly to the contactor block 24 and the apparatus for electric connection using the same.

In any of the foregoing embodiments, the inclined side acts as a retreat portion in the present invention. The retreat portion in the present invention, however, may be a recess, a notched portion or the like having a downward staged portion, so long as it is formed not only on the inclined side but also at least on the side.

In the following is explained an embodiment of a connecting contactor 72.

Figure 15:
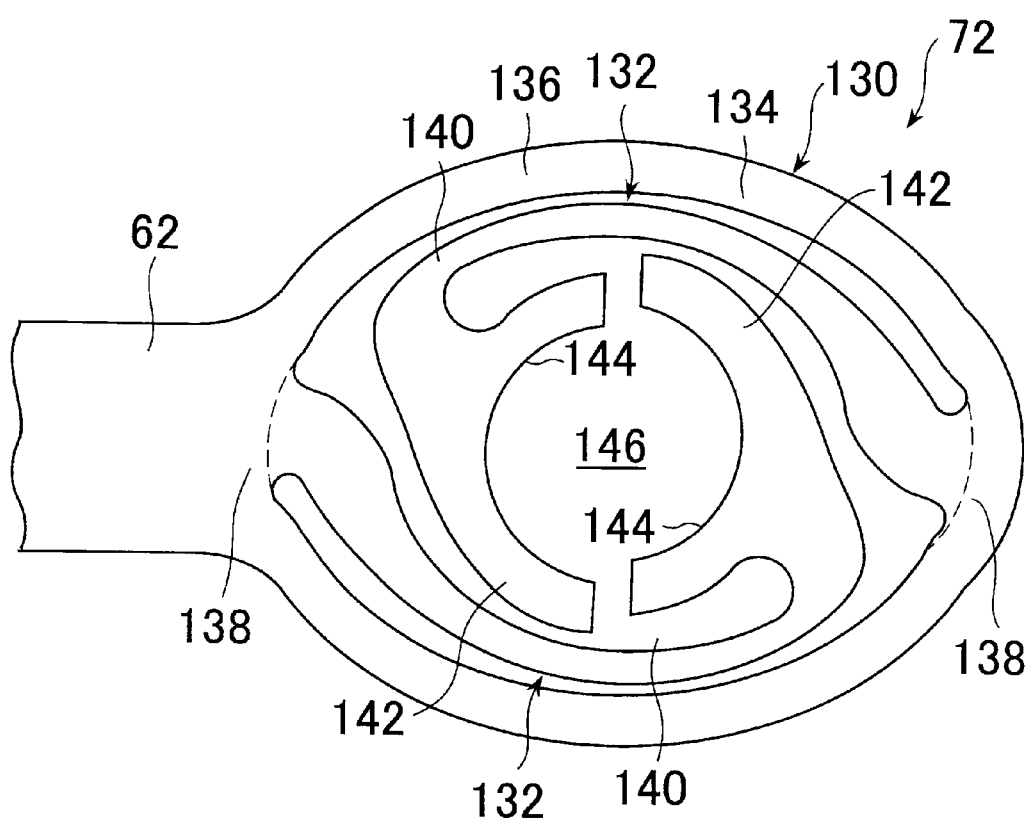
FIG. 15 is a plan view showing an embodiment of the connecting contactor block.

Referring to FIG. 15, the connecting contactor 72 is formed on the film integrally with the wiring portion 62 of the contact sheet 40. It is, however, possible to form the connecting contactor 72 separately from the wiring portion 62 and mount the connecting contactor 72 on the wiring portion 62.

The connecting contactor 72 includes an eye-shaped base 130 larger than the hole 74 of the film 60 shown in FIG. 10, and a pair of contact members 132 extending in a cantilever state from the base 130, and is made of a generally conductive metal material integrally like a thin plate shape. In this example, the hole 74 of the film 60 is also eye-shaped.

The base 130 has an ellipsoidal or elliptical opening 134 at its center. The opening 134 is formed by a pair of strip-like long piece portions 136 extending in the direction of the major axis and a pair of short piece portions 138 extending in the direction of the minor axis.

Both contact members 132 are formed symmetrically in rotation about the center of the opening 134. Each contact member 132 includes a pair of strip-like arm portions 140 extending in the direction of the major axis of the opening 134 along the inside of the long piece portion 136 of the base 130 and an armature portion 142 extending in the direction of the minor axis of the opening from the front end portion of each arm portion 140 along the inside of the arm portion 140.

Each armature portion 142 extends from the joint portion with the arm portion 140 in an arc-like form forward and backward in the extending direction of the arm portion 140, making the arc-shaped inner edge portion a contact edge portion 144 to be brought into contact with the sides of the conical head portion of the projected electrode 26 and directing the contact edge portion 144 toward the center side of the opening 134 so as to form a receiving space 146 for receiving the front end portion including the conical head portion of the projected electrode.

The contact edge portions 144 of both armature portions 142 have the same radius of curvature. Both contact edge portions 144 are, however, relatively displaced in the direction for tying both ends of the contact edge portion 144 (in the direction of the minor axis of the opening 134). In the illustration, both contact edge portions 44 are displaced such that the end portion of the side closer to the joint portion of the arm portion 140 and the base 130 comes closer to the center side of the opening 134 than the end portion of the side farther from the joint portion.

Since the connecting contactor 72 itself is planar, it can be produced by a simple method similarly to the wiring portion 62, dispensing with a use of a complicated process such as plating technique, etching technique or the like which uses a suitable mask such as the mask made of photoresist.

As shown in FIG. 10, with the wiring board 20 and the contactor blocks 24 assembled mutually, the connecting contactor 72 receives the conical head portion of the projected electrode, particularly, the front end (vertex) in a receiving space 146.

By this, the sides of the conical head portion of the projected electrode 26 are pressed by the contact edge portion 144 of the connecting contactor 72, and the connecting contactor 72 is elastically deformed mainly at the arm portion 140 of each contact member 132. Therefore, the connecting contactor 72 and the projected electrode 26 are brought into contact, and contact marks by the connecting contactor 72 are formed on the sides of the conical head portion of the projected electrode 26. However, the vertex of the projected electrode 26 is not pressed by the connecting contactor 72, so that the vertex is not collapsed.

If the contact member 132 is formed in rotation symmetry about the center of the opening 134, or if the arc-shaped contact edge portion 144 is directed toward the center side of the opening 134, the relative location of the connecting contactor 72 and the projected electrode 26 is determined by the contact member 132, so that the vertex of the projected electrode 26 will not come into contact with the connecting contactor 72 and that the connecting contactor 72 and the projected electrode 26 are more surely brought into contact.

Also, if the contact edge portion 144 extends in an arc-like form from the joint portion of the arm portion 140 and the armature portion 142 forward and backward in the extending direction of the arm portion 140, the contact edge portion 144 of the armature portion 142 extends along the side of the electrode, following the elastic deformation of the arm portion 140 when the contact edge portion 144 is pressed by the projected electrode 26, thereby more surely coming into contact with the projected electrode 26.

Further, if the contact edge portion 144 is relatively displaced in the direction of the minor axis of the opening 134, the contact edge portion 144 begins to come into contact with the sides of the conical head portion of the projected electrode 26 from the end portion located on the center side of the opening 134, following the elastic deformation of the arm portion 140, and finally, the contact edge portion 144 is brought into contact with the projected electrode 26 so as to form a part of a spiral, and as a result, to be more surely brought into contact with the projected electrode 26.

Particularly, when both contact edge portions 144 are relatively displaced such that the end portion of the contact edge portions 144 closer to the joint portion of the arm portion 140 and the base 130 comes closer to the center side of the opening 134 than the end portion on the side farther from the joint portion, the end portion of the contact edge portions 144 closer to the center of the opening 134 first comes into contact with the side of the projected electrode 114, while the other end side is not in contact with the projected electrode 26, so that with elastic deformation of the arm portion 140, the armature portions 142 are surely deformed such the contact edge portion 144 forms a part of a spiral, whereby the contact edge portion 144 comes into contact more surely with the projected electrode 26.

The present invention can also be applied to a material to be inspected other than an integrated circuit, for example, to a contactor block and an apparatus for electrical connection to be used for an electric test of a board for display such as a liquid crystal display panel. In particular, when the present invention is applied to an electric test of a board for display, other support means may be used as support means for assembling a specific region for a contactor portion, in place of a wiring board and a frame.

The present invention is not limited to the foregoing embodiments but can be modified variously without departing from the spirit.

What is claimed is:

1. A contactor block used for electrical testing of an integrated circuit, comprising:
   a beam-like holder having a strip-like underside area and a retreat portion formed in a widthwise edge portion of a side area following said underside area; and
   a contact sheet disposed on the outer periphery of said holder, said contact sheet being provided with a plurality of first contactor elements having a first contactor at one end portion, wherein said plurality of contactor elements extend widthwise of said underside area in positions corresponding at least to said underside area such that said first contactors are arranged at intervals in the longitudinal direction of said holder.

2. A contactor block according to claim 1, wherein said retreat portion includes one or more inclined sides inclined to said underside area.

3. A contactor block according to claim 1,
   wherein said holder further has a strip-like upside area, said contact sheet has a plurality of second contactors at intervals in the longitudinal direction of said holder, the second contactors arranged at positions corresponding the upside area of said holder, and a plurality of wiring portions electrically connecting said first contactors and said second contactors in a relation of one-to-one correspondence, and wherein said wiring portions have the positions where said first contactors are arranged to act as part of said probe elements.

4. A contactor block according to claim 1,
   wherein said holder further has a plurality of recesses made to individually correspond to at least one contactor group, each of which includes more than one of said first contactors, said recesses extending in the longitudinal direction of said holder within the arrangement range of the corresponding contactor groups and opening at least in said underside area; and at least one female screw holes made to correspond to each recess and communicating with the corresponding recess;
   wherein an elastic plate abutting on an arrangement area of the contactor group to which said contact sheet corresponds and a pressure plate abutting on the upside area of said elastic plate are disposed in each recess; and
   wherein an adjusting screw abutting on the upside area of said pressure plate is disposed in each screw hole.

5. A contactor block according to claim 1,
   wherein said holder further has a plurality of recesses extending at intervals in the longitudinal direction of said holder and opening at least in said underside area, and a plurality of female screw holes made to correspond to each recess and communicating to the corresponding recess;
   wherein an elastic plate abutting on said contact sheet and a pressure plate abutting on the upside of said elastic plate are disposed in each recess; and
   wherein an adjusting screw abutting on the upside area of said pressure plate is disposed in each screw hole.

6. A contactor block according to claim 1,
   wherein said underside area includes a flat face portion, said holder further has at least one triangular flange portion projecting sideward from said side area and has a bottom face flush with one end face portion of said underside area; and
   wherein said contact sheet is provided with an extended area located on said bottom face and an auxiliary contactor disposed in said extended area.

7. A contactor block according to claim 1,
   wherein said contact sheet includes an insulating sheet member and a plurality of wiring portions juxtaposed in said sheet member and said contactors are arranged in one end portion of said wiring portions; and wherein said sheet member has a plurality of slits for having the wiring end portions where said first contactors are arranged to act as said probe elements.

8. An apparatus for electrical connection comprising:
   a support means; and
   at least one contactor block according to claim 1
   wherein each of the first contactors of the at least one contactor block is directed downward.

9. An apparatus for electrical connection according to claim 8, wherein said support means includes a frame with a plurality of contactor blocks attached in parallel with each of their first contactors directed downward; and a wiring board provided with a plurality of wiring portions and to the underside of which said frame is attached.

* * * * *

UNITED STATES PATENT AND TRADEMARK OFFICE
CERTIFICATE OF CORRECTION

PATENT NO. : 6,672,877 B2
DATED : January 6, 2004
INVENTOR(S) : Yoshiei Hawegawa It is certified that error appears in the above-identified patent and that said Letters Patent is hereby corrected as shown below:

Column 10,
Line 13, wherein it reads "at least one female screw holes", should read: -- at least one female screw hole --.

Signed and Sealed this

Fifteenth Day of June, 2004

JON W. DUDAS
*Acting Director of the United States Patent and Trademark Office*